(12) United States Patent
Chan

(10) Patent No.: US 11,171,567 B1
(45) Date of Patent: Nov. 9, 2021

(54) POWER SUPPLY DEVICE FOR ELIMINATING RINGING EFFECT

(71) Applicant: Acer Incorporated, New Taipei (TW)

(72) Inventor: Tzu-Tseng Chan, New Taipei (TW)

(73) Assignee: ACER INCORPORATED, New Taipei (TW)

( * ) Notice: Subject to any disclaimer, the term of this patent is extended or adjusted under 35 U.S.C. 154(b) by 0 days.

(21) Appl. No.: 17/024,048

(22) Filed: Sep. 17, 2020

(30) Foreign Application Priority Data

May 11, 2020 (TW) ................................. 109115545

(51) Int. Cl.
*H02M 3/335* (2006.01)
*H03K 5/24* (2006.01)
*H02M 1/08* (2006.01)
*H02M 1/00* (2006.01)

(52) U.S. Cl.
CPC ......... *H02M 3/33569* (2013.01); *H02M 1/08* (2013.01); *H03K 5/24* (2013.01); *H02M 1/0048* (2021.05)

(58) Field of Classification Search
CPC ............... H02M 3/33569; H02M 1/08; H02M 2001/0048; H03K 5/24
USPC ........................................................ 327/540
See application file for complete search history.

(56) References Cited

U.S. PATENT DOCUMENTS 6,477,064 B1 11/2002 Weng et al.
9,331,585 B1 5/2016 Lin et al.

FOREIGN PATENT DOCUMENTS

| CN | 102624235 A | 8/2012 | |
| CN | 107181398 A | 9/2017 | |
| TW | 201328149 A | 7/2013 | |
| TW | 201328149 A1 * | 7/2013 | ............... H02M 1/42 |
| TW | 201605158 A | 2/2016 | |

OTHER PUBLICATIONS

Chinese language office action dated Nov. 6, 2020, issued in application No. TW 109115545.

* cited by examiner

*Primary Examiner* — Tomi Skibinski
(74) *Attorney, Agent, or Firm* — McClure, Qualey & Rodack, LLP

(57) ABSTRACT

A power supply device for eliminating the ringing effect includes a transformer, an output stage circuit, a power switch element, a pulse width modulation integrated circuit, and a control circuit. The transformer includes a main coil, a secondary coil, and an auxiliary coil. A leakage inductor is built in the transformer. The main coil receives an input voltage through the leakage inductor. The secondary coil generates an induced voltage. The output stage circuit generates an output voltage according to the induced voltage. A first parasitic capacitor is built in the power switch element. The control circuit includes an auxiliary inductor coupled to the auxiliary coil. The control circuit monitors the power switch element. If the power switch element is switched from an enable state into a disable state, the control circuit will couple the auxiliary inductor to the main coil and the leakage inductor of the transformer.

13 Claims, 4 Drawing Sheets

US 11,171,567 B1

POWER SUPPLY DEVICE FOR ELIMINATING RINGING EFFECT

CROSS REFERENCE TO RELATED APPLICATIONS

This application claims priority of Taiwan Patent Application No. 109115545 filed on May 11, 2020, the entirety of which is incorporated by reference herein.

BACKGROUND OF THE INVENTION

Field of the Invention

The disclosure generally relates to a power supply device, and more specifically, to a power supply device for eliminating the ringing effect.

Description of the Related Art

The non-ideal parasitic capacitance of a power switch element in a conventional power supply device may generate ringing, which not only leads to relatively large switching loss but also reduces the whole conversion efficiency of the power supply device. Accordingly, there is a need to propose a novel solution for solving the problems of the prior art.

BRIEF SUMMARY OF THE INVENTION

In a preferred embodiment, the invention is directed to a power supply device for eliminating a ringing effect. The power supply device includes a transformer, an output stage circuit, a power switch element, a PWM (Pulse Width Modulation) IC (Integrated Circuit), and a control circuit. The transformer includes a main coil, a secondary coil, and an auxiliary coil. A leakage inductor is built in the transformer. The main coil receives an input voltage through the leakage inductor, and the secondary coil generates an induced voltage. The output stage circuit generates an output voltage according to the induced voltage. The power switch element selectively couples the main coil to a ground voltage according to a PWM voltage. A first parasitic capacitor is built in the power switch element. The PWM IC generates the PWM voltage. The control circuit monitors the power switch element. The control circuit includes an auxiliary inductor coupled to the auxiliary coil. If the power switch element is switched from an enable state into a disable state, the control circuit will couple the auxiliary inductor to the main coil and the leakage inductor of the transformer.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are described in detail below.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

Figure 1:
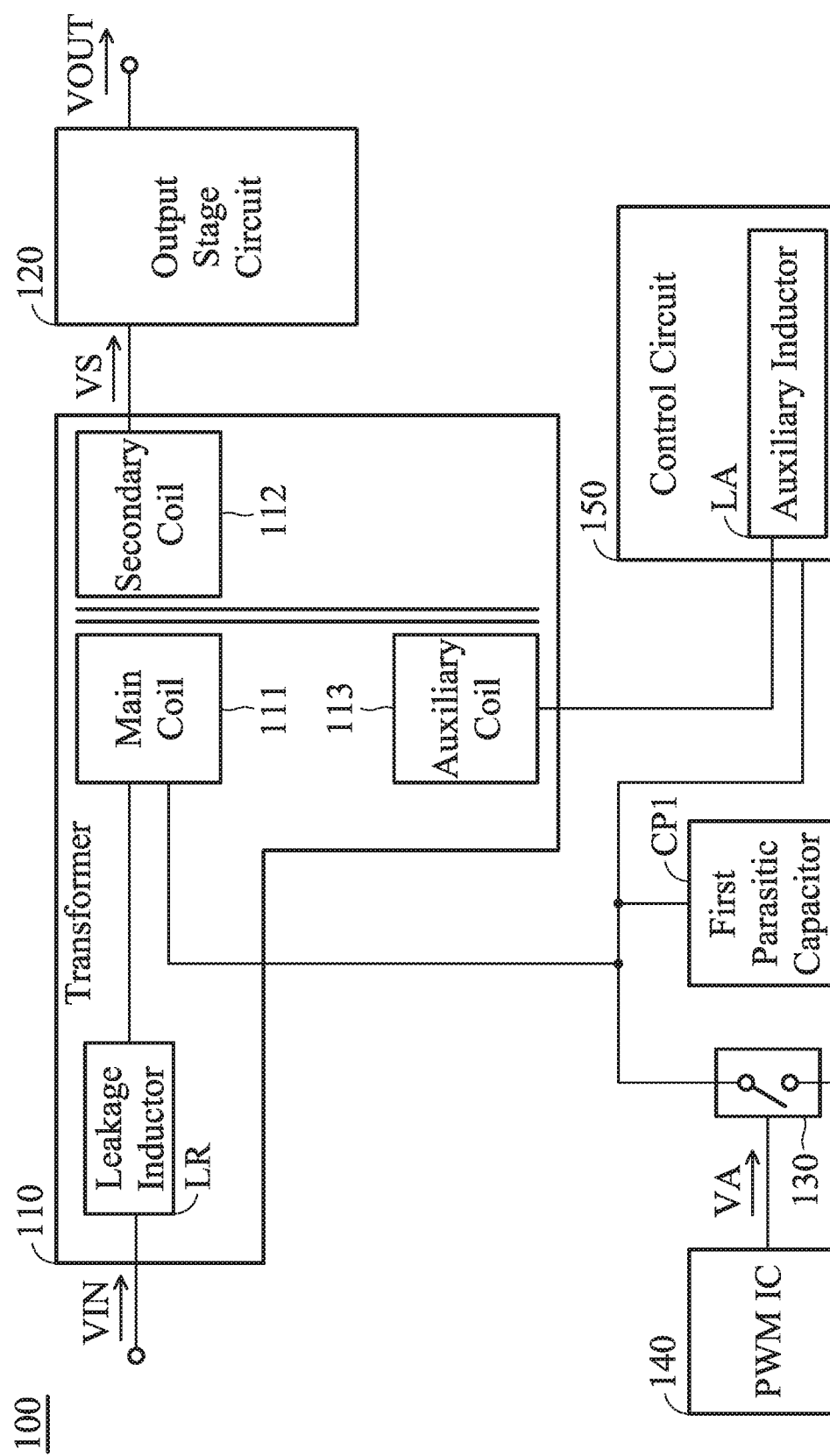
FIG. 1 is a diagram of a power supply device according to an embodiment of the invention.

FIG. 1 is a diagram of a power supply device 100 according to an embodiment of the invention. For example, the power supply device 100 may be applied to a desktop computer, a notebook computer, or an all-in-one computer. As shown in FIG. 1, the power supply device 100 includes a transformer 110, an output stage circuit 120, a power switch element 130, a PWM (Pulse Width Modulation) IC (Integrated Circuit) 140, and a control circuit 150. It should be noted that the power supply device 100 may further include other components, such as a voltage regulator and/or a negative feedback circuit, although they are not displayed in FIG. 1.

The transformer 110 includes a main coil 111, a secondary coil 112, and an auxiliary coil 113. At least a leakage inductor LR is built in the transformer 110. The leakage inductor LR is considered as a non-ideal parasitic element of the main coil 111. The main coil 111, the leakage inductor LR, and the auxiliary coil 113 are positioned at the same side of the transformer 110. The secondary coil 112 is positioned at an opposite side of the transformer 110. The main coil 111 receives an input voltage VIN through the leakage inductor LR. In response to the input voltage VIN, the secondary coil 112 generates an induced voltage VS. The input voltage VIN may be from an external input power source. For example, the input voltage VIN may be substantially an AC (Alternating Current) voltage or a DC (Direct Current) voltage, whose RMS (Root-Mean-Square) value may be from 100V to 400V, but it is not limited thereto. The output stage circuit 120 generates an output voltage VOUT according to the induced voltage VS. For example, the output voltage VOUT may be another DC voltage, whose voltage level may be from 18V to 22V, but it is not limited thereto. The power switch element 130 selectively couples the main coil 111 to a ground voltage VSS (e.g., 0V) according to a PWM (Pulse Width Modulation) voltage VA. For example, if the PWM voltage VA has a high logic level (e.g., a logic "1"), the power switch element 130 may couple the main coil 111 to the ground voltage VSS (e.g., the power switch element 130 is similar to a short-circuited path). Conversely, if the PWM voltage VA has a low logic level (e.g., a logic "0"), the power switch element 130 may not couple the main coil 111 to the ground voltage VSS (e.g., the power switch element 130 is similar to an open-circuited path). Furthermore, at least a first parasitic capacitor CP1 is built in the power switch element 130. It should be understood that the total parasitic capacitance between two terminals of the power switch element 130 is modeled as the aforementioned first parasitic capacitor CP1, which is not an external independent elements. The PWM IC 140 generates the PWM voltage VA. The control circuit 150 includes an auxiliary inductor LA coupled to the auxiliary coil 113 of the transformer 110. The control circuit 150 monitors the operation state of the power switch element 130. For example, if the power switch element 130 is switched from an enable state into a disable state, the control circuit 150 may couple the auxiliary inductor LA to the main coil 111 and the leakage inductor LR of the transformer 110. Otherwise, the auxiliary inductor LA may not be directly coupled to the main coil 111 and the leakage inductor LR. With such a design, once a ringing effect is induced between the leakage inductor LR of the transformer 110 and the first parasitic capacitor CP1 of the power switch element 130, the control circuit 150 can immediately couple the auxiliary inductor LA to the leakage inductor LR so as to suppress the non-ideal characteristic. Therefore, the invention can reduce the switching loss of the power switch element 130 and increase the conversion efficiency of the power supply device 100. It should be noted that the proposed power supply device 100 does not use a damping circuit consisting of resistors to suppress the ringing effect, without additionally increasing the power loss of the power supply device 100.

The following embodiments will introduce the detailed structure and operation of the power supply device 100. It should be understood these figures and descriptions are merely exemplary, rather than limitations of the invention.

Figure 2:
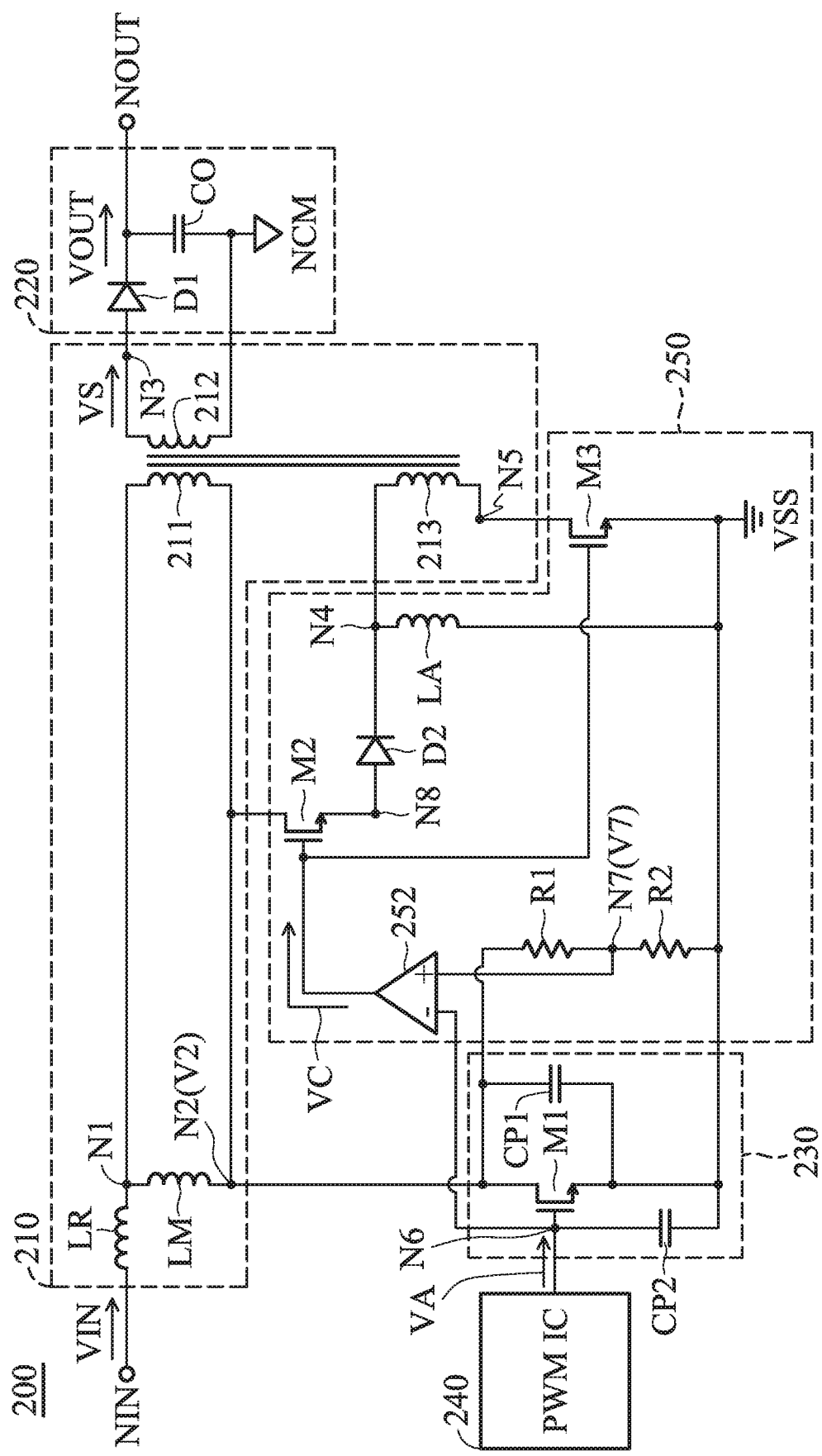
FIG. 2 is a diagram of a power supply device according to an embodiment of the invention.

FIG. 2 is a diagram of a power supply device 200 according to an embodiment of the invention. In the embodiment of FIG. 2, the power supply device 200 with an input node NIN and an output node NOUT includes a transformer 210, an output stage circuit 220, a power switch element 230, a PWM IC 240, and a control circuit 250. The input node NIN of the power supply device 200 is arranged for receiving an input voltage VIN from an external input power source. The output node NOUT of the power supply device 200 is arranged for outputting an output voltage VOUT to an electronic device.

The transformer 210 includes a main coil 211, a secondary coil 212, and an auxiliary coil 213. A leakage inductor LR and a magnetizing inductor LM are built in the transformer 210. The leakage inductor LR and the magnetizing inductor LM are inherent elements, which are generated when the transformer 210 is manufactured, and they are not external independent elements. The main coil 211, the leakage inductor LR, the magnetizing inductor LM, and the auxiliary coil 213 are positioned at the same side of the transformer 210. The secondary coil 212 is positioned at an opposite side of the transformer 210. Specifically, the leakage inductor LR has a first terminal coupled to the input node NIN, and a second terminal coupled to a first node N1. The magnetizing inductor LM has a first terminal coupled to the first node N1, and a second terminal coupled to a second node N2. The main coil 211 has a first terminal coupled to the first node N1, and a second terminal coupled to the second node N2. The secondary coil 212 has a first terminal coupled to a third node N3 for outputting an induced voltage VS, and a second terminal coupled to a common node NCM. The auxiliary coil 213 has a first terminal coupled to a fourth node N4, and a second terminal coupled to a fifth node N5.

The output stage circuit 220 includes a first diode D1 and an output capacitor CO. The first diode D1 has an anode coupled to the third node N3 for receiving the induced voltage VS, and a cathode coupled to the output node NOUT. The output capacitor CO has a first terminal coupled to the output node NOUT, and a second terminal coupled to the common node NCM.

The power switch element 230 includes a first transistor M1. The first transistor M1 may be an NMOS transistor (N-type Metal Oxide Semiconductor Field Effect Transistor). The first transistor M1 has a control terminal coupled to a sixth node N6 for receiving a PWM voltage VA, a first terminal coupled to a ground voltage VSS (e.g., 0V), and a second terminal coupled to the second node N2. A first parasitic capacitor CP1 and a second parasitic capacitor CP2 are built in the power switch element 230. Specifically, the first parasitic capacitor CP1 has a first terminal coupled to the second node N2, and a second terminal coupled to the ground voltage VSS. The second parasitic capacitor CP2 has a first terminal coupled to the sixth node N6, and a second terminal coupled to the ground voltage VSS. It should be understood that the total parasitic capacitance between the first terminal and the second terminal of the first transistor M1 is modeled as the aforementioned first parasitic capacitor CP1, and the total parasitic capacitance between the control terminal and the first terminal of the first transistor M1 is modeled as the aforementioned second parasitic capacitor CP2. The first parasitic capacitor CP1 and the second parasitic capacitor CP2 are not external independent elements.

The PWM IC 260 outputs the PWM voltage VA at the sixth node N6. The PWM voltage VA is used to adjust the duty cycle of the power switch element 230. For example, the PWM voltage VA may be maintained at a constant voltage level when the power supply device 200 is initialized, and the PWM voltage VA may provide periodic clock waveforms when the power supply device 200 is normally operated.

The control circuit 250 includes a comparator 252, a second transistor M2, a third transistor M3, a second diode D2, an auxiliary inductor LA, a first resistor R1, and a second resistor R2. The comparator 252 may be implemented with an operational amplifier. Each of the second transistor M2 and the third transistor M3 may be an NMOS transistor. The comparator 252 has a positive input terminal coupled to a seventh node N7, a negative input terminal coupled to the sixth node N6, and an output terminal for outputting a control voltage VC. For example, if the voltage V7 at the seventh node N7 is lower than or equal to the PWM voltage VA at the sixth node N6, the control voltage VC will have a low logic level. Conversely, if the voltage V7 at the seventh node N7 is higher than the PWM voltage VA at the sixth node N6, the control voltage VC will have a high logic level. The first resistor R1 has a first terminal coupled to the second node N2, and a second terminal coupled to the seventh node N7. The second resistor R2 has a first terminal coupled to the seventh node N7, and a second terminal coupled to the ground voltage VSS. That is, a voltage divider circuit is formed by the first resistor R1 and the second resistor R2.

The second transistor M2 has a control terminal for receiving the control voltage VC, a first terminal coupled to an eighth node N8, and a second terminal coupled to the second node N2. The second diode D2 has an anode coupled to the eighth node N8, and a cathode coupled to the fourth node N4. The auxiliary inductor LA has a first terminal coupled to the fourth node N4, and a second terminal coupled to the ground voltage VSS. The third transistor M3 has a control terminal for receiving the control voltage VC, a first terminal coupled to the ground voltage VSS, and a second terminal coupled to the fifth node N5.

In some embodiments, the power supply device 200 operates an initial mode, a first mode, a second mode, or a third mode, whose operation principles will be described as follows.

In the initial mode, the first transistor M1, the second transistor M2, the third transistor M3, and the first diode D1 are all disabled.

In the first mode, the PWM voltage VA has a high logic level for enabling the first transistor M1. At this time, the first parasitic capacitor CP1 is fully charged. On the other hand, the enabled first transistor M1 pulls the voltage V2 at the second node N2 almost down to the ground voltage VSS. With the voltage divider circuit (formed by the first resistor R1 and the second resistor R2), since the voltage V7 at the seventh node N7 must be lower than the PWM voltage VA at the sixth node N6, the comparator 252 can output the control voltage VC having a low logic level for disabling both the second transistor M2 and the third transistor M3.

In the second mode, the PWM voltage VA is switched from the high logic level to a low logic level, and thus the first transistor M1 is switched from the enabled state into a disable state. When the first transistor M1 is being switched, the aforementioned voltage divider circuit pulls up the voltage V7 at the seventh node N7 according to the instant high voltage V2 at the second node N2. Since the voltage V7 at the seventh node N7 is higher than the PWM voltage VA at the sixth node N6, the comparator 252 can output the control voltage VC having a high logic level for enabling both the second transistor M2 and the third transistor M3. At this time, the auxiliary inductor LA is coupled in parallel with the leakage inductor LR, and it prevents the leakage inductor LR from independently resonating with the first parasitic capacitor CP1 of the power switch element 230. It should be noted that the aforementioned ringing effect is usually induced in the second mode.

In the third mode, the PWM voltage VA is still maintained at the low logic level, the first transistor M1 is still disabled, and the second transistor M2 and the third transistor M3 are both still enabled. At this time, the voltage difference of the magnetizing inductor LM becomes reverse because of Lenz's law. Thus, the voltage V2 at the second node N2 may be substantially equal to the input voltage VIN plus the reverse voltage difference of the magnetizing inductor LM. The voltage V2 at the second node N2 has not been pulled down to the ground voltage VSS until the first transistor M1 is switched from the disable state back into the enable state.

Figure 3:
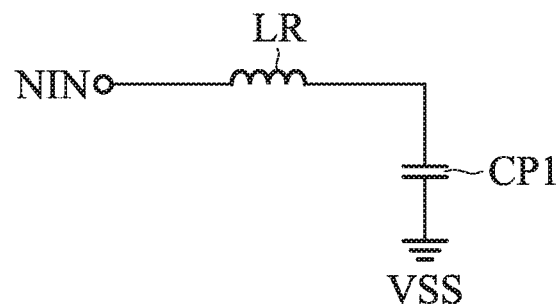
FIG. 3 is a diagram of an equivalent resonant circuit of a conventional power supply device operating in a second mode.
Figure 4:
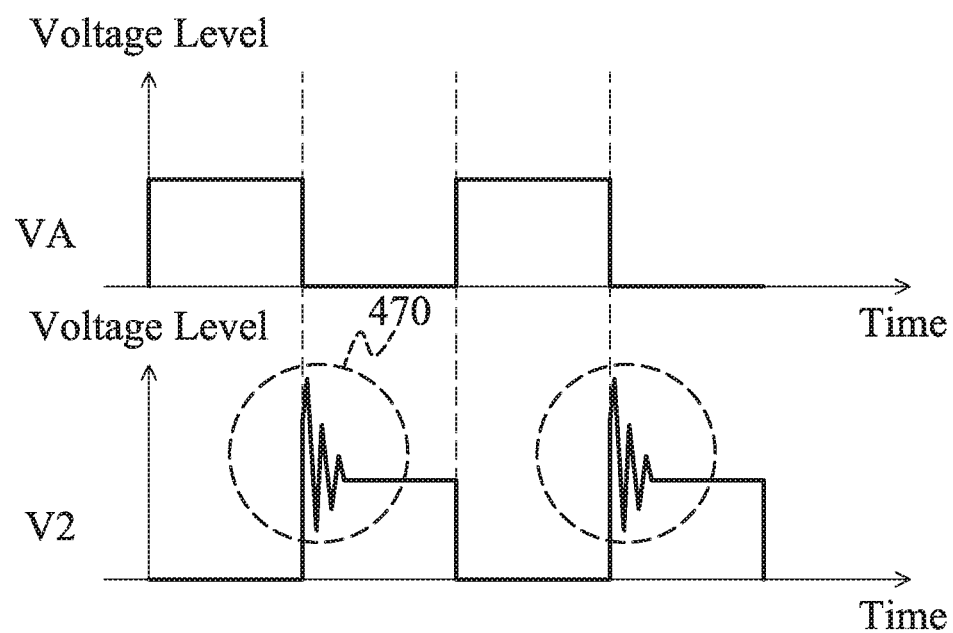
FIG. 4 is a diagram of voltage waveforms of a conventional power supply device operating in a second mode.

FIG. 3 is a diagram of an equivalent resonant circuit of a conventional power supply device operating in the second mode. FIG. 4 is a diagram of voltage waveforms of the conventional power supply device operating in the second mode. The horizontal axis represents time, and the vertical axis represents voltage levels. According to the measurement of FIG. 4, if the control circuit 250 and its auxiliary inductor LA were not used, a serious ringing effect would be induced between the first parasitic capacitor CP1 of the power switch element 230 and the leakage inductor LR of the transformer 210 (as indicated by a first dash-line box 470).

Figure 5:
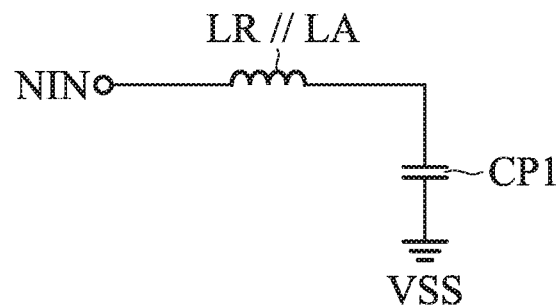
FIG. 5 is a diagram of an equivalent resonant circuit of a power supply device operating in a second mode according to an embodiment of the invention.
Figure 6:
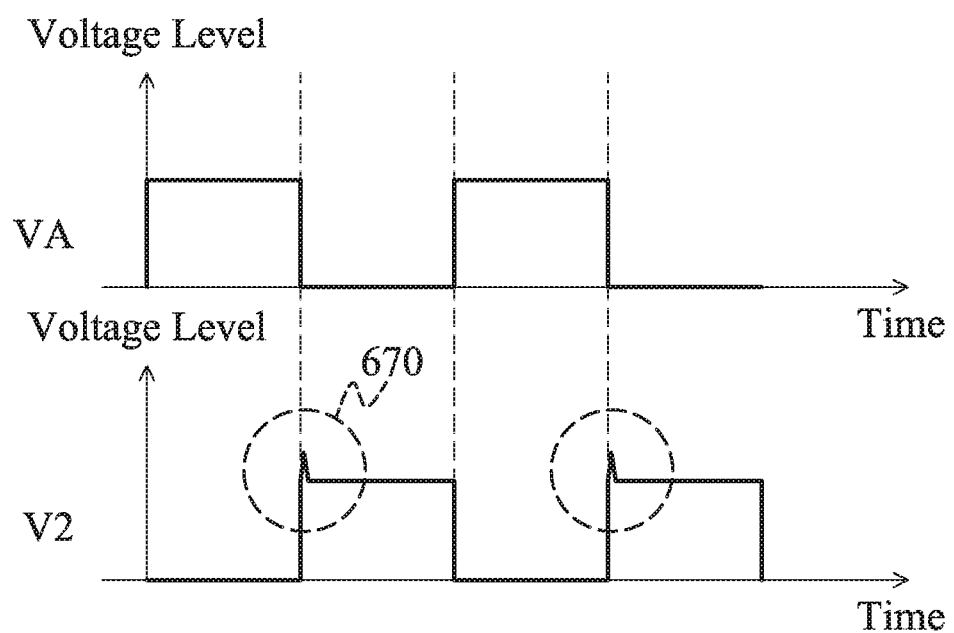
FIG. 6 is a diagram of voltage waveforms of a power supply device operating in a second mode according to an embodiment of the invention.

FIG. 5 is a diagram of an equivalent resonant circuit of the power supply device 200 operating in the second mode according to an embodiment of the invention. FIG. 6 is a diagram of voltage waveforms of the power supply device 200 operating in the second mode according to an embodiment of the invention. The horizontal axis represents time, and the vertical axis represents voltage levels. It should be noted the control circuit 250 and its auxiliary inductor LA are used in this case. When the first transistor M1 is switched from the enable state into the disable state, the leakage inductor LR of the transformer 210 is coupled in parallel with the auxiliary inductor LA of the control circuit 250, thereby significantly decreasing their total inductance. Therefore, the ringing effect between the first parasitic capacitor CP1 of the power switch element 230 and the leakage inductor LR of the transformer 210 can be almost eliminated (as indicated by a second dash-line box 670).

In some embodiments, the element parameters of the power supply device 200 are as follows. The inductance of the leakage inductor LR may be from 57 µH to 63 µH, such as 60 µH. The inductance of the magnetizing inductor LM may be from 285 µH to 315 µH, such as 300 µH. The inductance of the auxiliary inductor LA may be from 0.95 µH to 1.05 µF, such as 1 µH. The capacitance of the first parasitic capacitor CP1 may be from 90 pF to 110 pF, such as 100 pF. The capacitance of the second parasitic capacitor CP2 may be from 760 pF to 840 pF, such as 800 pF. The capacitance of the output capacitor CO may be from 612 µF to 748 µF, such as 680 µF. The resistance of the first resistor R1 may be from 18.81 KΩ to 19.19 KΩ, such as 19 KΩ. The resistance of the second resistor R2 may be from 0.99 KΩ to 1.01 KΩ, such as 1 KΩ. The turn ratio of the main coil 211 to the secondary coil 212 may be from 1 to 100, such as 10. The turn ratio of the main coil 211 to the auxiliary coil 213 may be from 1 to 200, such as 40. The above ranges of parameters are calculated and obtained according to the results of many experiments, and they help to optimize the conversion efficiency of the power supply device 200.

The invention proposes a novel power supply device, which includes a control circuit for suppressing the ringing effect. According to practical measurements, the power supply device using the aforementioned design can almost eliminate the non-ideal characteristics between the transformer and the power switch element. Since the invention can effectively improve the conversion efficiency of the power supply device and reduce the EMI (Electromagnetic Interference), it is suitable for application in a variety of devices.

Note that the above voltages, currents, resistances, inductances, capacitances and other element parameters are not limitations of the invention. A designer can adjust these parameters according to different requirements. The power supply device of the invention is not limited to the configurations of FIGS. 1-6. The invention may merely include any one or more features of any one or more embodiments of FIGS. 1-6. In other words, not all of the features displayed in the figures should be implemented in the power supply device of the invention. Although the embodiments of the invention use MOSFET as examples, the invention is not limited thereto, and those skilled in the art may use other types of transistors, such as BJT (Bipolar Junction Transistor), JFET (Junction Gate Field Effect Transistor), FinFET (Fin Field Effect Transistor), etc., without affecting the performance of the invention.

It will be apparent to those skilled in the art that various modifications and variations can be made in the invention. It is intended that the standard and examples be considered exemplary only, with the true scope of the disclosed embodiments being indicated by the following claims and their equivalents.

What is claimed is:

1. A power supply device for eliminating a ringing effect, comprising:
   a transformer, comprising a main coil, a secondary coil, and an auxiliary coil, wherein a leakage inductor is built in the transformer, the main coil receives an input voltage through the leakage inductor, and the secondary coil generates an induced voltage;
   an output stage circuit, generating an output voltage according to the induced voltage;
   a power switch element, selectively coupling the main coil to a ground voltage according to a PWM (Pulse Width Modulation) voltage, wherein a first parasitic capacitor is built in the power switch element;
   a PWM IC (Integrated Circuit), generating the PWM voltage; and
   a control circuit, monitoring the power switch element, and comprising an auxiliary inductor coupled to the auxiliary coil, wherein if the power switch element is switched from an enable state into a disable state, the control circuit couples the auxiliary inductor to the main coil and the leakage inductor of the transformer;
   wherein a magnetizing inductor is further built in the transformer;
   wherein the leakage inductor has a first terminal coupled to an input node for receiving the input voltage, and a second terminal coupled to a first node.

2. The power supply device as claimed in claim 1, wherein the magnetizing inductor has a first terminal coupled to the first node, and a second terminal coupled to a second node.

3. The power supply device as claimed in claim 2, wherein the main coil has a first terminal coupled to the first node, and a second terminal coupled to the second node, wherein the secondary coil has a first terminal coupled to a third node for outputting the induced voltage, and a second terminal coupled to a common node, and wherein the auxiliary coil has a first terminal coupled to a fourth node, and a second terminal coupled to a fifth node.

4. The power supply device as claimed in claim 3, wherein the output stage circuit comprises:
   a first diode, wherein the first diode has an anode coupled to the third node for receiving the induced voltage, and a cathode coupled to an output node for outputting the output voltage; and
   an output capacitor, wherein the output capacitor has a first terminal coupled to the output node, and a second terminal coupled to the common node.

5. The power supply device as claimed in claim 4, wherein the power switch element comprises:
   a first transistor, wherein the first transistor has a control terminal coupled to a sixth node for receiving the PWM voltage, a first terminal coupled to the ground voltage, and a second terminal coupled to the second node.

6. The power supply device as claimed in claim 5, wherein the first parasitic capacitor has a first terminal coupled to the second node, and a second terminal coupled to the ground voltage.

7. The power supply device as claimed in claim 6, wherein a second parasitic capacitor is further built in the power switch element, and wherein the second parasitic capacitor has a first terminal coupled to the sixth node, and a second terminal coupled to the ground voltage.

8. The power supply device as claimed in claim 7, wherein the control circuit further comprises:
   a comparator, wherein the comparator has a positive input terminal coupled to a seventh node, a negative input terminal coupled to the sixth node, and an output terminal for outputting a control voltage.

9. The power supply device as claimed in claim 8, wherein the control circuit further comprises:
   a first resistor, wherein the first resistor has a first terminal coupled to the second node, and a second terminal coupled to the seventh node; and
   a second resistor, wherein the second resistor has a first terminal coupled to the seventh node, and a second terminal coupled to the ground voltage.

10. The power supply device as claimed in claim 9, wherein the control circuit further comprises:
    a second transistor, wherein the second transistor has a control terminal for receiving the control voltage, a first terminal coupled to an eighth node, and a second terminal coupled to the second node.

11. The power supply device as claimed in claim 10, wherein the control circuit further comprises:
    a second diode, wherein the second diode has an anode coupled to the eighth node, and a cathode coupled to the fourth node.

12. The power supply device as claimed in claim 11, wherein the auxiliary inductor has a first terminal coupled to the fourth node, and a second terminal coupled to the ground voltage.

13. The power supply device as claimed in claim 12, wherein the control circuit further comprises:
    a third transistor, wherein the third transistor has a control terminal for receiving the control voltage, a first terminal coupled to the ground voltage, and a second terminal coupled to the fifth node.

* * * * *